United States Patent

Sawada et al.

[11] Patent Number: 6,049,313
[45] Date of Patent: Apr. 11, 2000

[54] MICROWAVE DETECTOR

[75] Inventors: Motoshi Sawada; Yuichi Kajita; Tetsuya Hosoi; Takehiko Sugiura; Hisao Ono, all of Tokyo, Japan

[73] Assignee: Yupiteru Industries Co., Ltd., Japan

[21] Appl. No.: 09/082,078

[22] Filed: May 20, 1998

[30] Foreign Application Priority Data

Jun. 10, 1997 [JP] Japan .................................. 9-166703

[51] Int. Cl.$^7$ ................................................ H01Q 13/00
[52] U.S. Cl. ........................................ 343/786; 343/776
[58] Field of Search .................... 343/786, 772; 331/107

[56] References Cited

U.S. PATENT DOCUMENTS 5,317,329  5/1994  Hatasa ...................................... 343/786
5,341,138  8/1994  Ono et al. ................................. 342/20

*Primary Examiner*—Don Wong
*Assistant Examiner*—Jennifer H. Malos
*Attorney, Agent, or Firm*—Marger Johnson & McCollom, P.C.

[57] ABSTRACT

A microwave detector includes a horn antenna and cavity formed by covering a metallic film of a printed substrate with an opened bottom microwave circuit component, and further includes a mixer diode which is positioned at the feeding point of the horn antenna and sandwiched between the microwave circuit component and the printed substrate, the mixer diode including a mixer diode substrate having a first protruding portion at a first end of the mixer diode substrate and a second protruding portion at a second end of the mixer diode substrate, separate anode and cathode electrode patterns formed on a surface of the substrate which includes the protruding portions, and a beam-lead-type or flip-chip-type diode which is mounted to a surface of the mixer diode substrate near the center thereof, the beam-lead-type or flip-chip-type diode having an anode and a cathode which are surface mounted to the anode and cathode electrode patterns to form electrically conducting pathways therewith, wherein the first and second protruding portions are directly or indirectly connected respectively to the microwave circuit component and the printed substrate.

14 Claims, 7 Drawing Sheets

(A)

(B)

(A)

(B)

(A)

(B)

MICROWAVE DETECTOR

BACKGROUND OF THE INVENTION

1. Field of the Invention

The present invention relates to a microwave detector for detecting microwaves emitted from measuring devices and the like, and in particular relates to an improvement in the structure of the reception frequency conversion portion which carries out frequency mixing of the wave received by a horn antenna and the output of a local oscillator.

2. Description of the Prior Art

Microwave detectors which generate an alarm upon detecting microwaves having the specific microwave frequencies emitted by radar-type speed measurement devices are known in the prior art. In this connection, typical traffic monitoring radar-type speed measurement devices employ a plurality of microwave frequency bands, including the 10 GHz band (X band), 24 GHz band (K band) and 35 GHz band (Ka band). These kinds of speed measuring microwave detectors receive prescribed microwave bands with a super-heterodyne type circuit having a structure described below.

In general, a horn antenna is used for the reception antenna. Arranged at the feeding point of the slot portion of such antenna is a mixer diode. Further, a microwave circuit composed of a local oscillator is provided in the interior of the slot portion of the horn antenna. In such arrangement, the signals received by the horn antenna and the output of the local oscillator undergo frequency mixing in the mixer diode. Further, a suitable filter is provided between the mixing step and the local oscillator to prevent the reception input by the horn antenna from having an adverse effect on the operation of the local oscillator. In this regard, two general types of microwave detectors are known: a first type constructed from a local oscillator and a mixer, in which a microwave circuit uses a waveguide; and a second type constructed from a local oscillator and a mixing portion, in which a microwave integrated circuit uses a microstrip line.

In this connection, the present invention is directed toward the first type constructed from a microwave circuit which uses a waveguide, and an example of this type is disclosed in Japanese Laid-Open Patent Application No. HEI 5-308219. The invention disclosed in this publication is similar to that shown in FIG. 1. Namely, as shown in this drawing, a wide-area metallic film (e.g., copper foil) 11 having a prescribed pattern is formed on top of a printed substrate 10. Further, a microwave circuit component 12 made of die-cast aluminum is secured to the printed substrate 10 by screws so as to cover the metallic film 11 portion of the printed substrate 10. The microwave circuit component 12 includes a horn antenna portion 12a and a cavity portion 12b which together form an open space in the entire underside surface of the microwave circuit component 12, and this open space in the underside of the microwave circuit component 12 is filled by the metallic film 11 when the microwave circuit component 12 is secured to the top of the printed substrate 10. In this way, a horn antenna and a cavity which communicates with the back of a slot portion of the horn antenna are constructed by securing the microwave circuit component 12 to the top of the printed substrate 10. Further, screw-type adjustment pins 20a, 20b are provided near the horn antenna slot portion of the microwave circuit component 12.

A boss portion 12c is integrally formed in the slot portion of the horn antenna portion 12a of the microwave circuit component 12, and a through hole 13 which faces the boss portion 12c is formed in the printed substrate 10. Further, a pin-shaped leg 15a of a metallic pedestal 15 is fitted into the through hole 13 via a spring washer 16. The upper surface of the pedestal 15 includes a hole which is arranged coaxially with the hole of the boss portion 12c, and fitted into these holes of the boss portion 12c and pedestal 15 are the pin portions of both ends of a bill-type mixer diode 14. In this way, the mixer diode 14 is arranged at the slot portion feeding point of the horn antenna in a sandwiched state between the printed substrate 10 and the microwave circuit component 12.

Further, a microwave substrate 17 is housed inside the cavity enclosed between the metallic film 11 of the printed substrate 10 and the cavity portion 12b of the microwave circuit component 12. A local oscillator is mounted in the microwave substrate 17. The oscillatory output of the local oscillator is emitted into the space inside the cavity and reaches the slot portion of the horn antenna, and as described above, because the mixer diode 14 is arranged at the slot portion, frequency mixing of the antenna input and the first local oscillator output are carried out in a microwave circuit mode.

Further, although omitted from the drawings, an intermediate frequency processing circuit portion is horizontally mounted at a peripheral portion of the through hole on the underside of the printed substrate 10. This intermediate frequency processing portion includes a first intermediate frequency filter for inputting the output of the mixer diode 14, a second local oscillator, and a second mixer circuit for carrying out frequency mixing of the output of the second local oscillator and the output of the first intermediate frequency filter. Also, a sealed case is secured to the underside of the printed substrate 10 to cover this intermediate frequency processing circuit portion.

As for the pattern of the metallic film 11 on top of the printed substrate 10, it is designed not only to fill the space underneath the microwave circuit component 12, but to function as a shield for the intermediate frequency processing circuit portion as well. Further, low frequency circuits such as a wave detection circuit, a reception signal discrimination circuit and an alarm circuit are mounted on another region of the printed substrate 10.

Now, as shown in FIG. 2, the mixer diode 14 is constructed from a cylindrical ceramic tube 14a which is open at both ends, and an anode electrode 14b and a cathode electrode 14c which are mounted to the ceramic tube 14a to plug both ends thereof. Further, a diode chip 14d is mounted to the upper end of the cathode electrode 14c (inside the ceramic tube 14a), and this diode chip 14d is electrically connected to the anode electrode 14b by bonding wires 14e.

Unfortunately, because there is no amplification circuit in the circuit design described above in which the reception signals and output of the local oscillator undergo frequency mixing in the mixer diode 14 and are directly converted to an intermediate frequency, the frequency conversion loss of the mixer circuit has a large effect on sensitivity. Accordingly, in order to improve the sensitivity, it is essential to make such conversion loss as small as possible. In this regard, the conversion loss is related to many factors, such as the characteristics of the mixer diode, the input voltage from the local oscillator, the impedance matching between the mixer diode and the antenna, and the impedance matching between the mixer diode and the local oscillator.

In the bill-type structure described above, the main factors which determine the impedance of the mixer diode 14 are, in addition to the junction capacitance and series resistance inside the diode, the package capacitance and the inductance of the bonding wire 14e. Further, the higher the frequency of the microwave and milliwave, the larger the effect of such factors.

Further, a Ga-As Schottky barrier-type diode is generally used for the microwave mixer diode 14. The junction capacitance inside the diode is semiconductor characteristic and is determined by the semiconductor material and the structure of the device. In the same way, the package capacitance and the bonding wire inductance are determined by the package material and structure. However, even though conversion loss can be lowered by lowering the impedance, it is difficult to remove the inherent impedance component of the circuit component described above.

SUMMARY OF THE INVENTION

With a view toward overcoming the problems of the prior art described above, it is an object of the present invention to provide a highly sensitive microwave detector, in which the frequency conversion loss of the mixer circuit is lowered by forming a prepared circuit component having a lower inherent impedance.

In order to achieve the object stated above, the present inventor considered the use of beam-lead-type or flip-chip-type diode. In the case of the flip-chip-type diode, because the bare chip is surface mounted directly in the circuit without the use of a package, there is no need for bonding wire, and this makes it possible to eliminate the element which generated the impedance component described above, and because the impedance of the chip itself is also lowered, it is possible to lower the frequency conversion loss of the mixer circuit. However, because the mechanical strength of such a flip-chip-type diode is extremely low, it is not possible to directly mount the flip-chip-type diode in the requisite microwave circuit component of the present invention.

In response to this, a structure was developed to achieve impedance matching and lower the frequency conversion loss of the mixer circuit while using a flip-chip-type diode. In this connection, a first structure of a microwave detector according to the present invention comprises:

a printed substrate;

an electrically conductive microwave circuit component provided on top of the printed substrate so as to integrally form a horn antenna having a slot portion and a cavity which communicates with the rear of the slot portion of the horn antenna;

a microwave circuit substrate;

a local oscillator mounted on the microwave circuit substrate and housed inside the cavity;

a horn antenna slot portion feeding point formed in the upper surface of the microwave circuit component;

a through hole formed in the lower surface of the microwave circuit component so as to face the feeding point of the horn antenna; and a mixer diode positioned at the feeding point of the horn antenna, the mixer diode including a first end which is directly or indirectly connected to the feeding point of the horn antenna, a second end which is directly or indirectly connected to the printed substrate with the through hole preventing a short circuit from forming between the second end of the mixer diode and the microwave circuit component, a mixer diode substrate having a first protruding portion at a first end of the mixer diode substrate and a second protruding portion at a second end of the mixer diode substrate, separate anode and cathode electrode patterns formed on a surface of the substrate which includes the protruding portions, and a beam-lead-type or flip-chip-type diode which is mounted to a surface of the mixer diode substrate near the center thereof, the beam-lead-type or flip-chip-type diode having an anode and a cathode which are surface mounted to the anode and cathode electrode patterns to form electrically conducting pathways therewith, wherein the first and second protruding portions are directly or indirectly connected respectively to the microwave circuit component and the printed substrate.

The structure described above is suitable for the type of microwave detector in which an entire microwave circuit component made of die-cast aluminum or the like forms the horn antenna and cavity. However, the present invention is not limited to this structure, and it is possible to apply the present invention to the type of microwave detector in which the horn antenna and cavity are formed in a portion of the microwave circuit component. Namely, for this type, a second structure of the microwave detector according to the present invention comprises:

a printed substrate;

an electrically conductive microwave circuit component which is provided on top of the printed substrate, the microwave circuit component having an open underside portion which covers the metallic foil, whereby the microwave circuit component and the metallic foil integrally form a horn antenna having a slot portion and a cavity which communicates with the rear of the slot portion of the horn antenna;

a microwave circuit substrate;

a local oscillator mounted on the microwave circuit substrate and housed inside the cavity;

a horn antenna slot portion feeding point formed in the upper surface of the microwave circuit component; and a mixer diode positioned at the feeding point of the horn antenna and sandwiched between the microwave circuit component and the printed substrate, the mixer diode including a mixer diode substrate having a first protruding portion at a first end of the mixer diode substrate and a second protruding portion at a second end of the mixer diode substrate, separate anode and cathode electrode patterns formed on a surface of the substrate which includes the protruding portions, and a beam-lead-type or flip-chip-type diode which is mounted to a surface of the mixer diode substrate near the center thereof, the beam-lead-type or flip-chip-type diode having an anode and a cathode which are surface mounted to the anode and cathode electrode patterns to form electrically conducting pathways therewith, wherein the first and second protruding portions are directly or indirectly connected respectively to the microwave circuit component and the printed substrate.

In both of the structures of the present invention described above, "surface mounting" is carried out directly by placing the anode and cathode of the diode in contact with the anode and cathode electrode patterns and then applying an adhesive or solder to fix them in place, or indirectly by forming an electrically conducting pathway by means of an electrically conducting adhesive or solder arranged therebetween. In the latter case, the connection can be made my means of a metallic bump or the like to minimize surface contact.

Further, even though the electrically conducting microwave circuit component is described in the embodiments of the present invention as being formed from a metal (in particular, die-cast aluminum, but other metals of course being usable), the present invention is in no way limited to the use of metal for forming the microwave circuit component, and it is also possible to use either an electrically conducting non-metallic material such as electrically conducting resin or a non-conducting resin or plastic which is formed into shape and platted on the top and/or underside surface with an electrically conducting material. In other words, it is possible to use any material having the necessary properties for an antenna.

In the first structure described above, the horn antenna and cavity are formed by the microwave circuit component, and in the second structure described above, the horn antenna and cavity are constructed by the microwave circuit component and the metallic foil of the printed substrate. In both of these structures, a local oscillator is housed inside the cavity, with the output of the local oscillator and the antenna input undergo frequency mixing by the mixer diode in a microwave circuit mode. Further, the output of the mixer diode is guided from the point where the output terminal is mounted to the printed substrate to a prescribed intermediate frequency processing circuit portion of the printed substrate.

In this connection, in accordance with the structures described above, the impedance of the flip-chip-type diode is low and the frequency conversion loss is small. Further, the problems mentioned above in relation to the low mechanical strength of the diode are eliminated by surface mounting the diode to the mixer diode substrate. Furthermore, because the anode and cathode of the diode are mounted to anode and cathode electrode patterns on the mixer diode substrate, there is no need for bonding wires and the like, and this makes it possible eliminate or greatly suppress the generation of the unwanted impedance component.

Furthermore, by changing dimensions such as the length and/or width of at least one of the anode and cathode electrode patterns, it is possible to introduce inductance and capacitance components between the microwave circuit component and the mixer diode, and this makes it easy to adjust the impedance for optimum performance. Of course, minor adjustments can be carried after manufacture or at a prescribed time by removing a portion of such pattern.

Preferably, an elastic body is provided to bias the mixer diode substrate toward either the microwave circuit component or the printed substrate. In this way, it is possible to prevent poor contact between the mixer diode and the microwave circuit component and/or the printed substrate. Further, by forming the elastic body from an electrically conducting material, it is possible to form an electrically conducting pathway between the mixer diode and the microwave circuit component or the printed substrate via the elastic body.

Further, at least one of the anode and cathode electrode patterns can be formed to extend over both side surfaces of the respective protruding portion of the mixer diode substrate. In this connection, the front surface electrode patterns can be easily formed by using a printed mixer diode substrate, and the side surface electrode pattern can be easily formed by applying an electrically conducting material such as plating or the like. Further, at least one of the anode and cathode electrode patterns can also be formed on the rear surface of the mixer diode substrate, and at least one through hole can be formed through the mixer diode substrate t connect such rear surface electrode pattern to the respective front surface electrode pattern. In this connection, the connection made via the through hole formed in the mixer diode substrate can be achieved by applying an electrically conducting film to the inside surface of the through hole or by plugging the through hole with an electrically conducting material to form a so-called closed bare hole.

Now, by forming the electrode pattern on the sides of the mixer diode substrate, the electrode pattern is given a solid formation, and this lowers the inductance. Further, by forming a through hole in the mixer diode substrate, a strong electrical connection is established between the electrode patterns formed on the front and rear surfaces of the protruding portion, and because the through hole is equivalent to forming a thick electrode portion, the inductance is lowered. As a result, the impedance of the electrode pattern is lowered.

Further, by forming a first connecting hole in the microwave circuit component to connect the first protruding portion of the mixer diode to the microwave circuit component and a second connection hole in the printed substrate to connect the second protruding portion of the mixer diode to the printed substrate, and by making the dimensions of the contacting surfaces inside at least one of the connection holes match the dimensions of the respective protruding portion, it becomes possible to set the angular position of the mixer diode at a desired angle with respect to the microwave circuit component by inserting the respective protruding portion into the connecting hole formed with matching dimensions.

Further, by forming the mixer diode substrate to have a length which is shorter than the distance between the microwave circuit component and the printed substrate, it is possible to provide a metallic connecting member between the microwave circuit component and the printed substrate to form a series connection with the mixer diode substrate. In this connection, even though the metallic connecting member is described in the embodiments as being arranged between the mixer diode substrate and the printed substrate, the present invention is not limited to this structure, and it is possible to arrange the metallic connecting member between the mixer diode substrate and the microwave circuit component. Of course, it is also possible to arrange a metallic connecting member between the mixer diode substrate and the printed substrate and between the mixer diode substrate and the microwave circuit component.

DETAILED DESCRIPTION OF THE PREFERRED EMBODIMENTS

Figure 1:
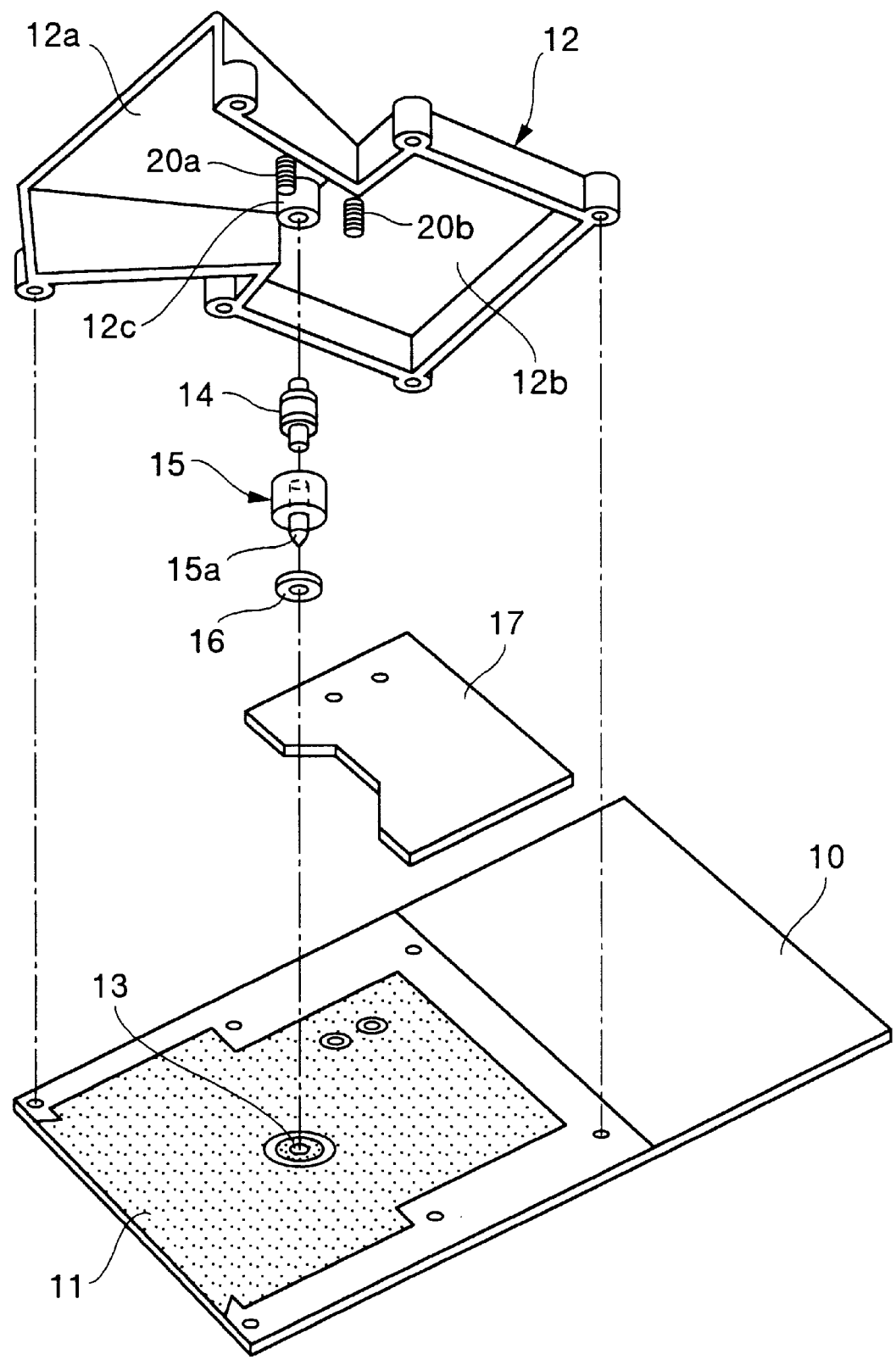
FIG. 1 is an exploded perspective view on one example of a prior art microwave detector.

Except for a modification of the mixer diode which forms the mixer circuit, the basic structure of the microwave detector is similar to the prior art microwave detector shown in FIG. 1. Accordingly, a detailed description of such modification will be given below.

Figure 3:
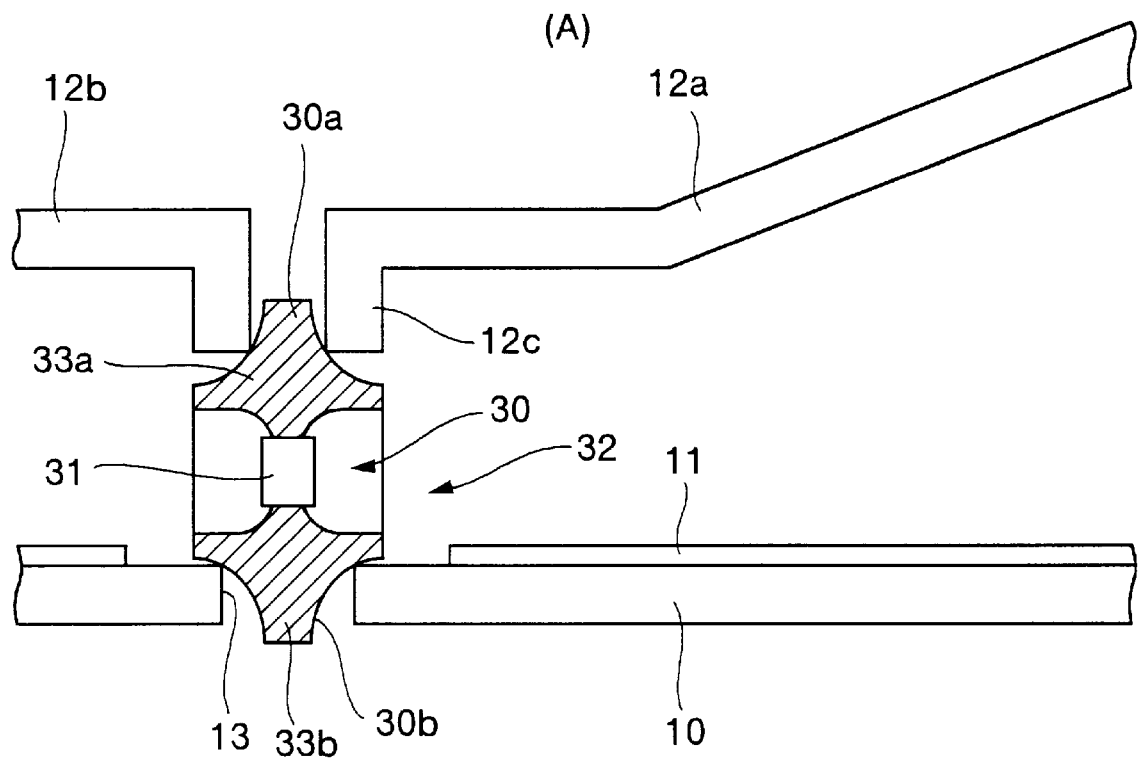
FIGS. 3 (A), (B) show a first embodiment of the present invention.
Figure 3:
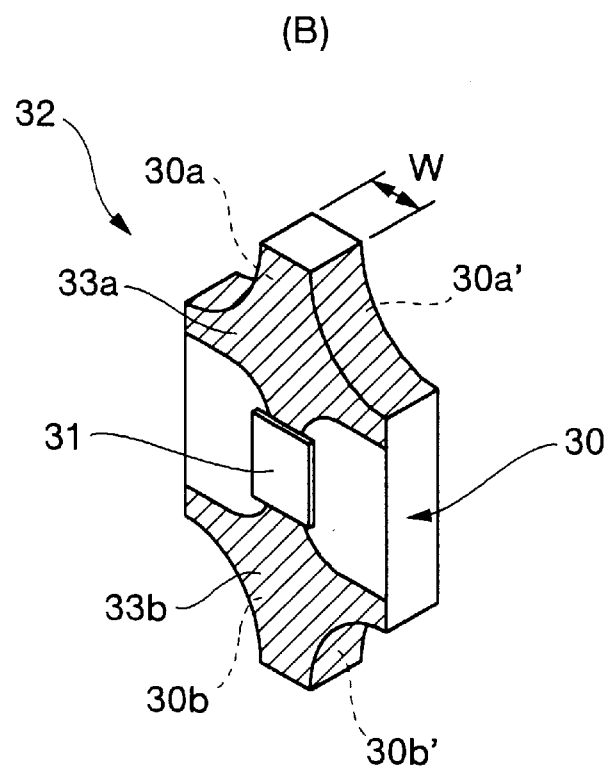

FIGS. 3(A), (B) are enlarged views of a mixer circuit portion which forms the essential portion of the present invention. In the structure shown in FIG. 3 (A), the elements that are the same as those shown in FIG. 1 are designated by the same reference numbers. As shown in FIG. 3(B), a mixer diode 32 is constructed from a substrate 30 and a flip-chip-type diode 31 which is mounted on a surface of the substrate 30. Of course, it is possible to use a beam-lead-type diode in place of the flip-chip-type diode 31.

In addition to forming a mounting board for mounting the diode 31, the substrate 30 also serves to electrically and mechanically connect the anode and cathode of the diode 31 respectively to the printed substrate 10 and the microwave circuit component 12 (horn antenna 12a). The specific structure is described below.

Namely, the substrate 30 is constructed from a printed substrate formed from a dielectric base material such as glass epoxy, Teflon (registered trademark), ceramics or the like. Further, the substrate 30 is shaped as a rectangle with the four corners thereof removed so as form protruding portions 30a, 30b at both ends in the lengthwise direction. The width W of both protruding portions 30a, 30b taken with respect to the surface of the substrate 30 are tapered toward the ends thereof. In this way, the surfaces 30a=92, 30b=92 of the sides of the protruding portions 30a, 30b have at least one curved portion.

Further, an anode electrode pattern 33a and a cathode electrode pattern 33b are formed on prescribed regions of the substrate 30 which include the periphery of both protruding portions 30a, 30b. The anode electrode pattern 33a is formed from the four side surfaces of the protruding portion 30a up to the vicinity of the center of the surface of the substrate 30 to enable surface mounting with the anode of the diode 31. Similarly, the cathode electrode pattern 33b is formed from the four side surfaces of the protruding portion 30b up to the vicinity of the center of the surface of the substrate 30 to enable surface mounting with the cathode of the diode 31.

In this way, when the diode 31 is mounted to the center of the substrate 30, the anode and cathode of the diode 31 are respectively surface mounted to the anode electrode pattern 33a and the cathode electrode pattern 33b.

As described above, the microwave circuit component 12 is made from die-cast aluminum and is integrally formed into a horn antenna portion 12a and a cavity portion 12b for holding a local oscillator. Further, a boss portion 12c is integrally formed at the slot portion of the horn antenna portion 12a, and a through hole 13 which faces the boss portion 12c is formed in the printed substrate 10. With this structure, the mixer diode 32 is mounted between the microwave circuit component 12 and the printed substrate 10 by inserting the protruding portions 30a, 30b respectively into the hole formed in the boss portion 12c and the through hole 13 of the printed substrate 10. In this way, because the protruding portions 30a, 30b are respectively in contact with the boss portion 12c and the through hole 13, the anode and cathode electrode patterns 33a, 33b formed on the surfaces of the protruding portions 30a, 30b form electrically conducting pathways with the boss portion 12c and the through hole 13.

Consequently, because the anode of the diode 31 is electrically connected to the horn antenna 12a and the cavity 12b via the anode electrode pattern 33a and the boss portion 12c, the reception signals and the output of the local oscillator undergo frequency mixing in the diode 31. Further, the related mixed frequency signal is sent from the cathode of the diode 31 to an intermediate frequency processing circuit portion formed in the printed substrate 10 via the cathode electrode pattern 33b and the through hole 13, and a prescribed signal process such as a process to detect whether the target microwave is present or absent is carried out. In this way, a mixer circuit is constructed by arranging the mixer diode 32 at the slot portion feeding point of the horn antenna in a sandwiched state between the printed substrate 10 and the microwave circuit component 12. Of course, the anode and cathode may be arranged at reversed positions with respect to those described above.

Further, in the present embodiment, the protruding portions 30a, 30b have quadrilateral shaped outlines. Accordingly, by forming the hole portion of the boss portion 12c and the through hole 13 to have a prescribed size quadrilateral shaped plane cross section which matches the shape of the protruding portions 30a, 30b, it is possible to easily set the direction of the substrate 30 (mixer diode 32) at a prescribed angle with respect to the microwave circuit merely by inserting the protruding portions 30a, 30b into the boss portion 12c and the through hole 13.

Namely, because the electrode patterns 33a, 33b are plate shaped, the impedance of the microwave circuit is changed in accordance with the direction of the substrate 30 at the time of insertion into the microwave circuit. Accordingly, by setting the shape of the hole portion of the boss portion 12c to establish the optimum impedance in advance, it becomes possible to automatically obtain the optimum impedance and lower the frequency conversion loss merely by inserting the protruding portion 30a into the boss portion 12c without having to think about angular adjustments at the time of assembly. Now, in order to carry out angular alignment, at least one of the boss portion 12 and the through hole 13 may be formed with internal dimensions which match the outer dimensions of the protruding portions 30a, 30b.

Figure 4:
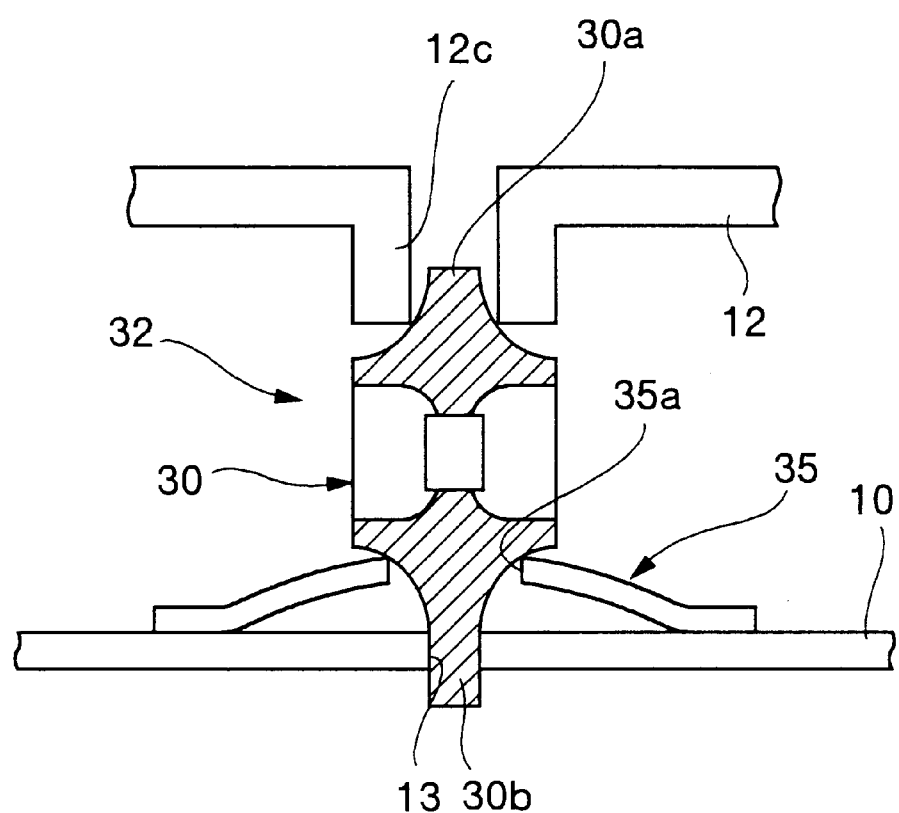
FIG. 4 shows a second embodiment of the present invention.
Figure 4:
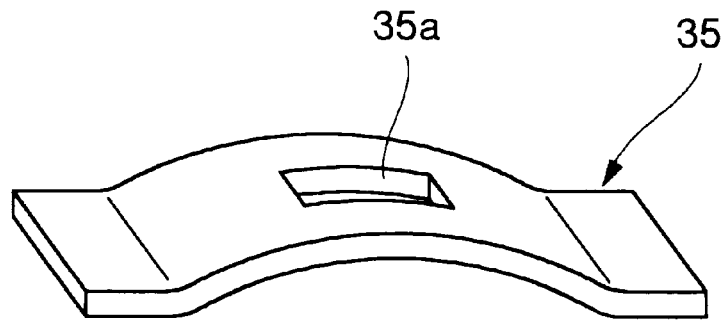

Next, FIGS. 4(A), (B) show a second embodiment of the present invention. As shown in FIG. 4(B), the second embodiment uses a plate spring 35, with the elastic restoring force of the plate spring 35 being utilized to force the anode electrode pattern 33a of the mixer diode 32 into firm contact with the boss portion 12c. In this way, it is possible to avoid problems such as bad circuit conductivity and large resistance loss due to poor contact. Now, because this structure may make it possible for spaces to form between the cathode electrode pattern 33b and the through hole 13, a more secure electrical and mechanical connection can be achieved by carrying out soldering or the like at the through hole 13. Further, in the case where the plate spring 35 is formed from an electrically conducting material such as a metal plate, the conducting pathway with the intermediate frequency circuit can be designed through the plate spring 35. Further, in the present embodiment, the protruding portion 30b of the substrate 30 is inserted through a through hole 35a formed in the plate spring 35, and by shaping the through hole 35a to match the external shape of the protruding portion 30b, the through hole 35a can function as a means of carrying out the angular alignment described above.

Now, even though the plate spring 35 in the embodiment shown in the drawings was described as being provided on the printed substrate 10, the present invention is not limited to this structure, and the plate spring may of course be provided on the microwave circuit component 12. Further, the present invention is not limited to the use of a plate spring, and it is possible to use a variety of other spring members such as coil springs and the like. Further, the present invention is not limited to the use of springs, and it is possible to use other elastic members including spring-like washers such as C-rings and elastic packing.

Figure 5:
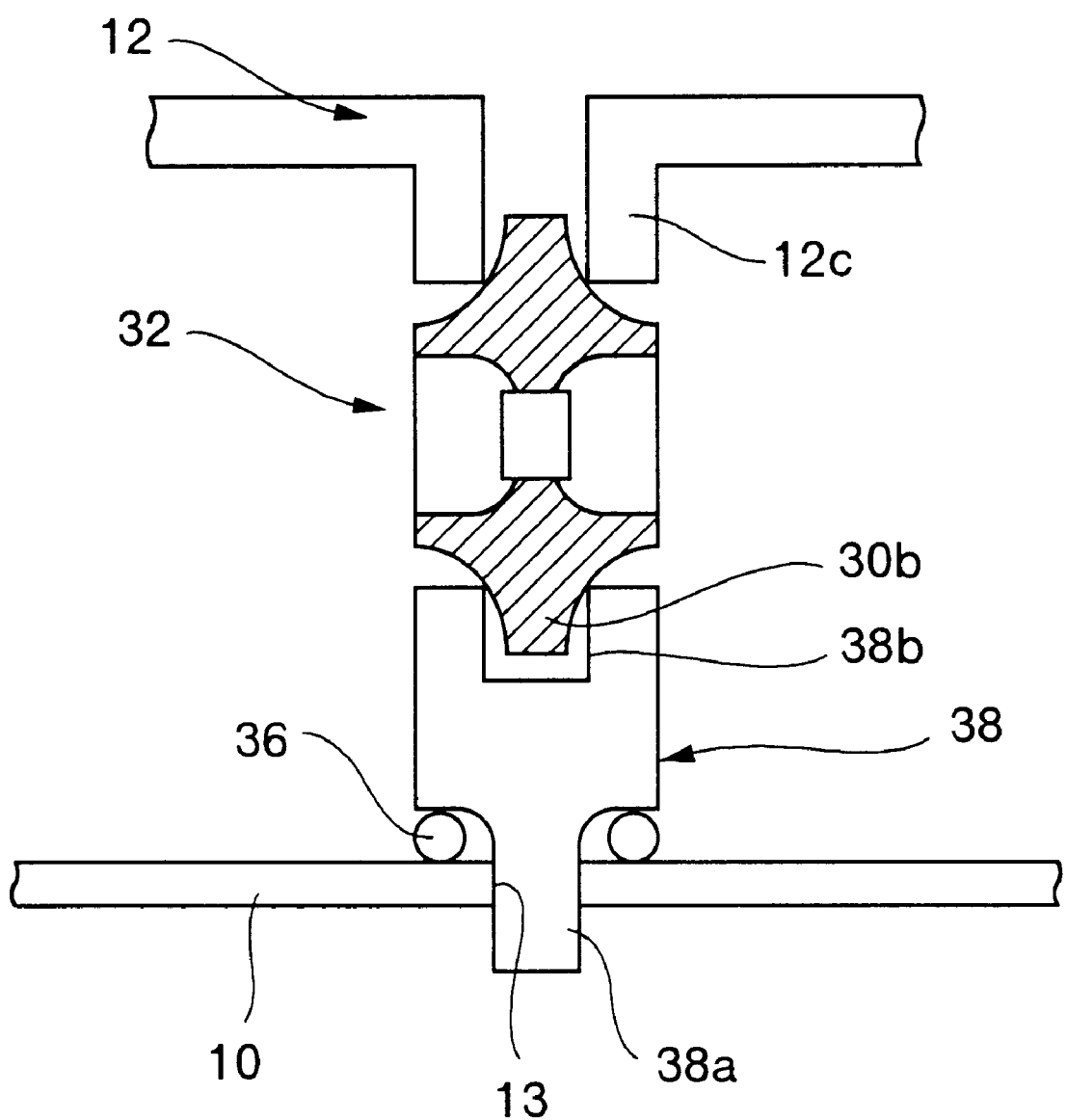
FIG. 5 shows a third embodiment of the present invention.

Next, FIG. 5 shows a third embodiment of the present invention. In this embodiment a spring 36 (spring washer) is used in the same manner as that shown in the embodiment of FIG. 4 to prevent poor contact as much as possible. Further, in this third embodiment, and metallic connecting member 38 is interposed between the mixer diode 32 and the through hole 13 of the printed substrate 10.

The electrode patterns 33a, 33b formed in the substrate 30 are made of metallic foil and include an inductance component. Accordingly, as the electrode pattern is made longer, the inductance component becomes larger, and even though the use of the flip-type diode 31 is designed to lower the impedance component, the large inductance generated by the electrode patterns 33a, 33b make it impossible to sufficiently lower the impedance of the entire mixer circuit.

Thus, the length of the entire substrate 30 is shortened in order to shorten the length of the electrode patterns 33a, 33b which cause the increase in the impedance component. However, this makes the substrate 30 shorter than the spacing between the microwave circuit component 12 and the printed substrate 10, and therefore the substrate 30 can not be mounted by itself. In response to such situation, the connecting member 38 is interposed as described above to make up such shortage. Further, because the connecting member 38 is electrically conductive, the cathode of the diode 32 forms a conductive pathway with the through hole 13 via the connecting member 38.

Now, in order to suppress the generation of inductance, the plane cross-sectional area of the connecting member 38 can be made relatively high and dense. Further, a protruding portion 38a adapted for insertion into the through hole 13 is formed on the bottom end of the connecting member 38, and a concave portion 38b adapted to receive the protruding portion 30b of the mixer diode 32 is formed in the top of the connecting member 38.

Figure 6:
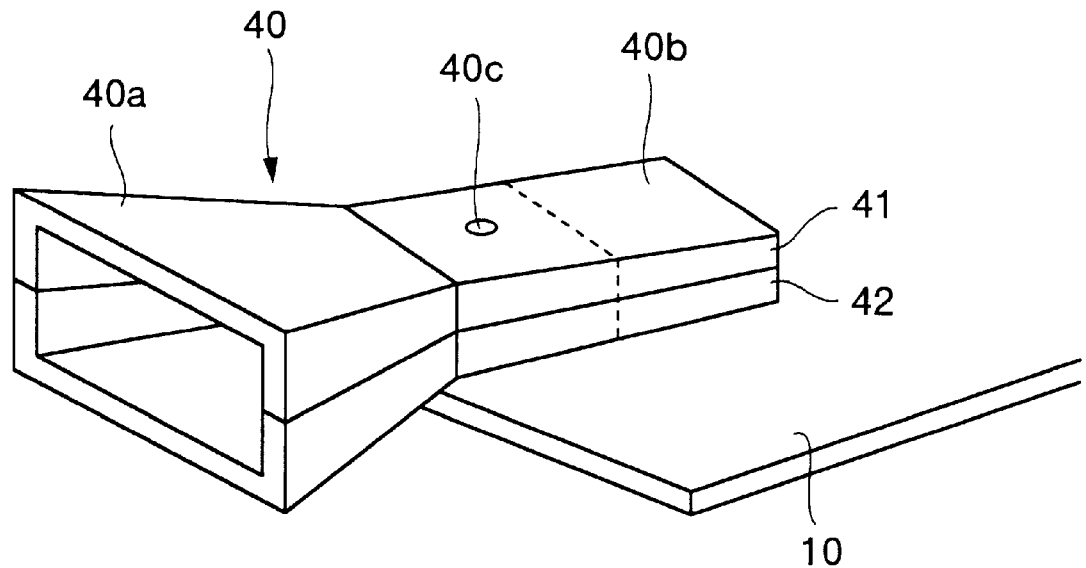
FIGS. 6 and 7 show a fourth embodiment of the present invention.
Figure 7:
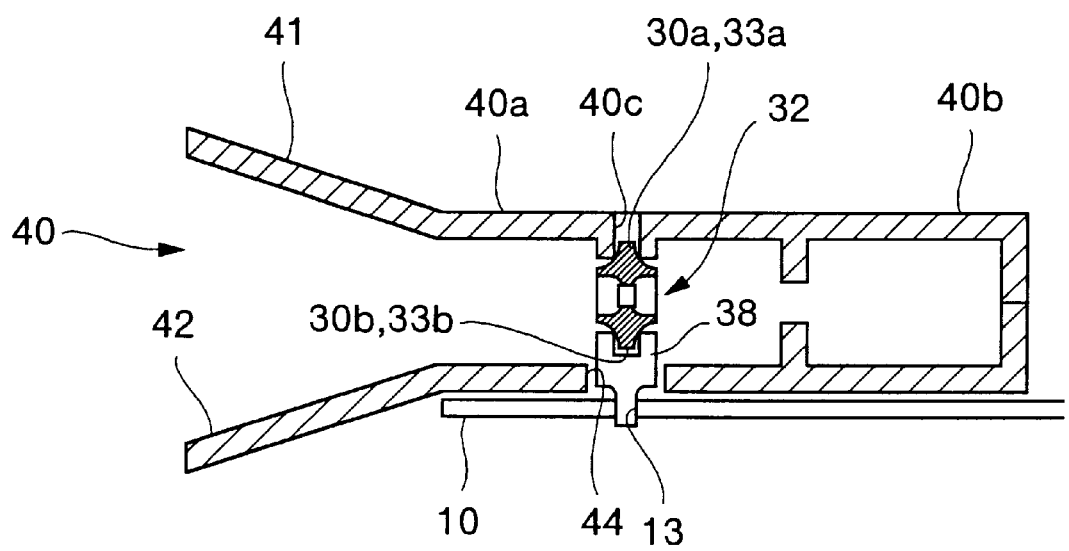

Next, FIGS. 6 and 7 show a fourth embodiment of the present invention. In this connection, while the embodiments described above were suitable for use in the type of microwave detector shown in FIG. 1 in which the horn antenna and the like is constructed from the microwave circuit component 12 and the metallic film 11 form on the printed substrate 10, the present embodiment is suitable for use in the type of microwave which has a horn antenna and the like formed from only a microwave circuit component.

Namely, a microwave circuit component 40 is formed by joining two halves comprised of an upper component (cover) 41 and a lower component (base) 42 made of, for example, die-cast aluminum or the like. Further, a horn antenna portion 40a and cavity portion 40b for holding a local oscillator are integrally formed by the metallic microwave circuit component 40. In this way, a horn antenna and a local oscillator housing cavity which communicates with the rear of the slot portion of the horn antenna are the general structures formed by constructing the whole metallic microwave component. Further, the microwave circuit component 40 is mounted on top of a printed substrate 10.

The upper component 41 has a short height and is shaped roughly the same as the shape of the lower opened microwave circuit component 12 of the embodiments described above. Further, the lower component 42 has roughly the same shape as the upper component 41, but they differ with regards to the points described below. Namely, a boss portion 40c is integrally formed at the slot portion of the horn antenna portion 40a in the bottom of the upper component 41 of the microwave circuit 40, and a through hole 44 which faces the boss portion 40c is formed in the lower component 42. Further, in the same manner as was described above, a through hole 13 is formed in the printed substrate 10 so that the boss portion 40c, the through hole 44 and the through hole 13 are arranged on a single straight line in the vertical direction.

Also, in the same manner as was described above, the protruding portion 30a formed with the anode electrode pattern 33a of the mixer diode 32 is adapted to be mounted to the boss portion 40c. Further, the protruding portion 30b formed with the cathode electrode pattern 33b of the mixer diode 32 is adapted form a conducting pathway with the through hole 13 of the printed substrate 10 via the connecting member 38. In this connection, the inner diameter of the through hole 44 is made sufficiently larger than the outer shape of the connecting member 38 to prevent the connecting member 38 from coming into contact with the lower component 41 of the microwave circuit component 40. Now, because this embodiment is different from the third embodiment only in regards to the structure of the microwave circuit component which forms the horn antenna and the like, a description of the other essential elements of the present invention which are the same as those described for the third embodiment will be omitted.

Figure 2:
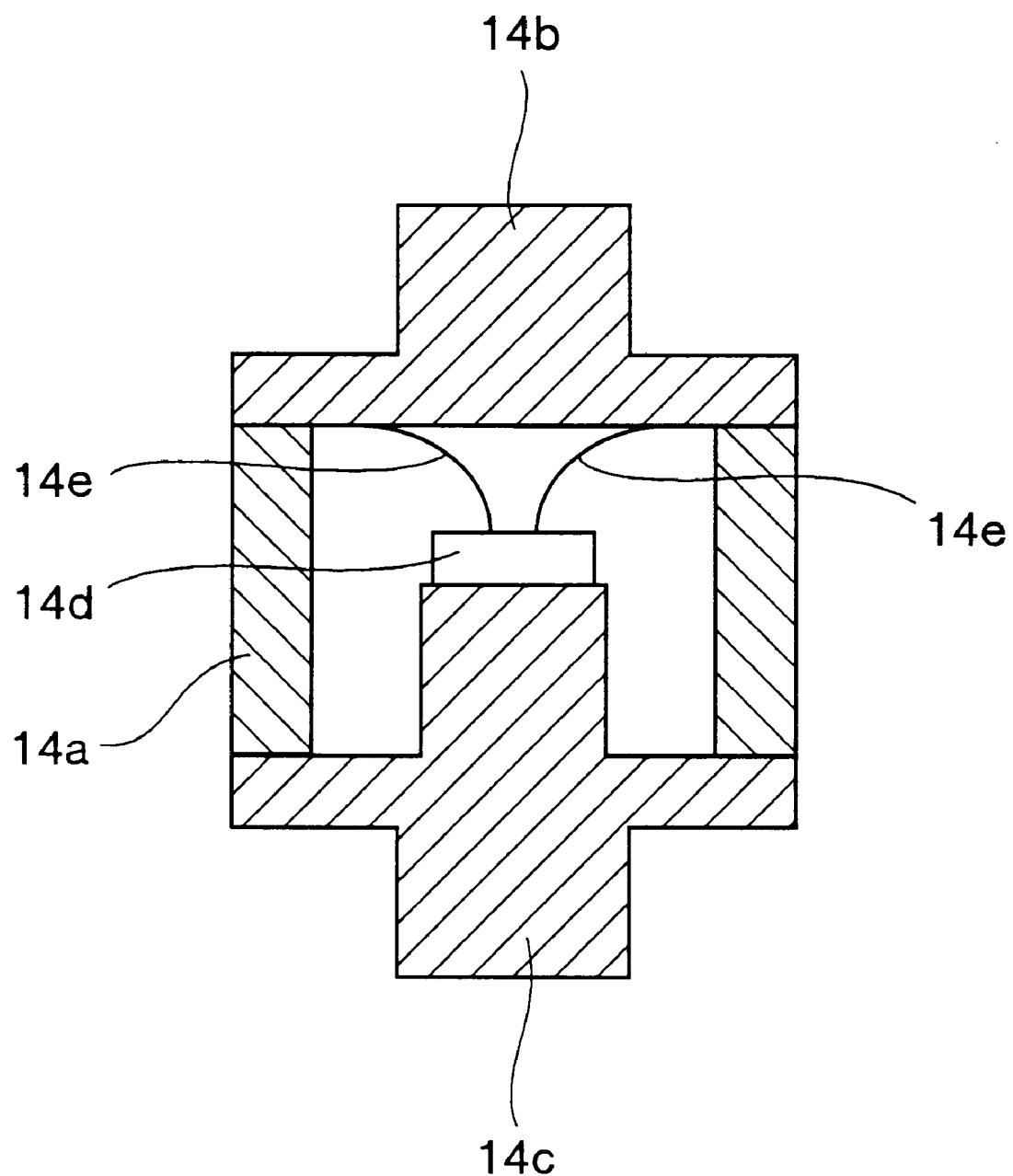
FIG. 2 is a cross-sectional view showing the structure of a prior art mixer diode.

In this connection, it is of course possible to adapt the embodiment shown in FIGS. 6 and 7 in to enable the mixer diode 32 to be directly connected to the printed substrate 10 without the provision of the connecting member 38 in the same manner as described above for the first embodiment shown in FIG. 2. Furthermore, in the same manner as was described for the second embodiment, it is of course possible to provide the structure of the fourth embodiment with an elastic body such as a plate spring or spring body arranged at a suitable position to bias the mixer diode in a prescribed direction.

Figure 8:
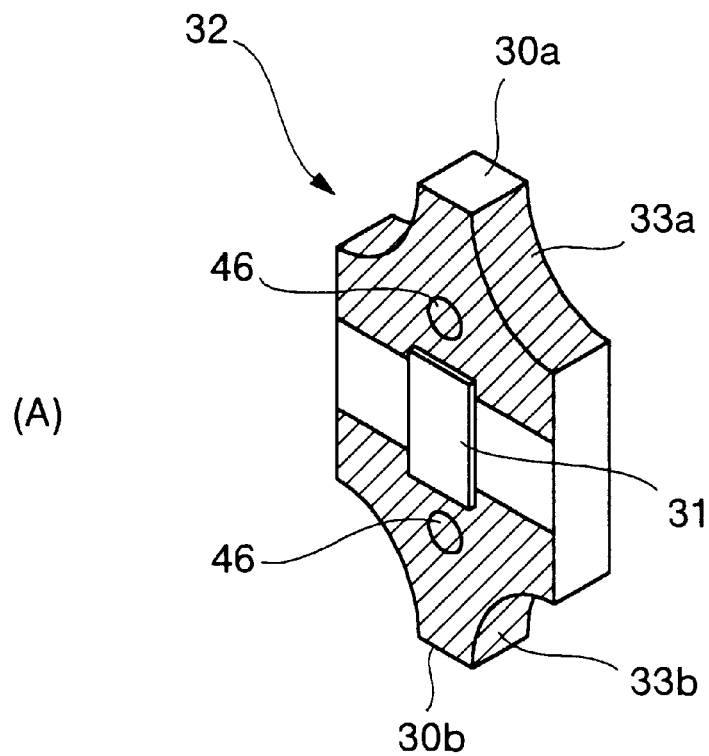
FIG. 8 shows a fifth embodiment of the present invention.
Figure 8:
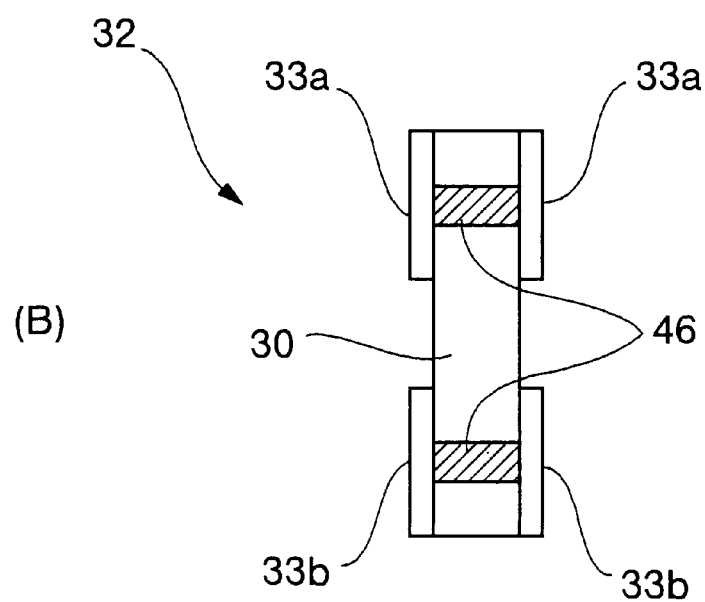

Next, FIG. 8 shows a fifth embodiment of the present invention which is related to an improvement of the mixer diode 32. In this regard, in the embodiments described above, the electrode patterns were formed on the four peripheral surfaces of the protruding portions 30a, 30b. Accordingly, the electrode patterns are formed on both the front surface of the substrate 30, where the diode 31 is mounted, and on the rear surface thereof. In addition to this, in the present embodiment the substrate 30 is also provided with through holes 46 which pass through the substrate 30. In this way, electrically conducting pathways are established between the electrode patterns on the front and back of the substrate 30 not only through the side peripheral portions, but also through the inside of the substrate 30 via the through holes 46.

Furthermore, even though electrode patterns were formed on all four peripheral surfaces of the protruding portions 30a, 30b in the embodiments described above, the present invention is not limited to such structure, and it is possible, for example, to form an electrically conducting film on only the front and rear surfaces of the protruding portions 30a, 30b and not on the side surfaces 30a=92, 30b=92 thereof. In such case, where no electrically conducting film is formed on the side surfaces, through holes may or may not be provided. Further, it is also possible to omit the electrode pattern from the rear surface as well and form an electrode pattern on only the front surface of the substrate 30.

Now, in the microwave detector according to the present invention, because the mixer diode structure includes a diode which is surface mounted to a substrate, with the substrate used to form connections with a microwave circuit component and a printed substrate, it becomes possible to lower the impedance of the diode itself and eliminate or largely suppress the cause of the generation of unwanted inductance. As a result, by forming a structure which lowers the inherent impedance of a prepared circuit component, the present invention makes it possible to lower the frequency conversion loss of the mixer circuit and thereby construct a highly sensitive microwave detector.

What is claimed is:

1. A microwave detector, comprising:

a printed substrate;

an electrically conductive microwave circuit component provided on top of the printed substrate so as to integrally form a horn antenna having a slot portion and a cavity which communicates with the rear of the slot portion of the horn antenna;

a microwave circuit substrate;

a local oscillator mounted on the microwave circuit substrate and housed inside the cavity;

a horn antenna slot portion feeding point formed in the upper surface of the microwave circuit component;

a through hole formed in the lower surface of the microwave circuit component so as to face the feeding point of the horn antenna; and a mixer diode positioned at the feeding point of the horn antenna, the mixer diode including a first end which is directly or indirectly connected to the feeding point of the horn antenna, a second end which is directly or indirectly connected to the printed substrate with the through hole preventing a short circuit from forming between the second end of the mixer diode and the microwave circuit component, a mixer diode substrate having a first protruding portion at a first end of the mixer diode substrate and a second protruding portion at a second end of the mixer diode substrate, separate anode and cathode electrode patterns formed on a surface of the substrate which includes the protruding portions, and a beam-lead-type or flip-chip-type diode which is mounted to a surface of the mixer diode substrate near the center thereof, the beam-lead-type or flip-chip-type diode having an anode and a cathode which are surface mounted to the anode and cathode electrode patterns to form electrically conducting pathways therewith, wherein the first and second protruding portions are directly or indirectly connected respectively to the microwave circuit component and the printed substrate.

2. The microwave detector of claim 1, further comprising an elastic body, wherein the elastic restoring force of the elastic body is used to bias the mixer diode substrate toward either the microwave circuit component or the printed substrate.

3. The microwave detector of claim 2, wherein the elastic body is made of an electrically conductive material so as to establish an electrically conducting pathway either between the mixer diode and the microwave circuit component or between the mixer diode and the printed substrate.

4. The microwave detector of claim 1, wherein the formation of at least one of the anode and cathode electrode patterns is extended over both side surfaces of the respective protruding portion of the mixer diode substrate.

5. The microwave detector of claim 1, wherein at least one of the anode and cathode electrode patterns is also formed on a rear surface of the mixer diode substrate, and at least one through hole is formed in the mixer diode substrate to connect the rear surface electrode pattern with the respective front surface electrode pattern.

6. The microwave detector of claim 1, further comprising a first connection hole formed in the microwave circuit component to connect the first protruding portion of the mixer diode to the microwave circuit component, and a second connection hole formed in the printed substrate to connect the second protruding portion of the mixer diode to the printed substrate, wherein the dimensions of the contacting surfaces inside at least one of the connection holes are formed to roughly match the dimensions of the respective protruding portion to enable the angular position of the mixer diode to be set at a desired angle with respect to the microwave circuit component by inserting the respective protruding portion into the connecting hole formed with matching dimensions.

7. The microwave detector of claim 1, wherein the mixer diode substrate is formed to have a length which is shorter than the distance between the microwave circuit component and the printed substrate, and further comprising a metallic connecting member which is mounted between the microwave circuit component and the printed substrate to form a series connection with the mixer diode substrate.

8. A microwave detector, comprising:

a printed substrate;

an electrically conductive microwave circuit component which is provided on top of the printed substrate, the microwave circuit component having an open underside portion which covers the metallic foil, whereby the microwave circuit component and the metallic foil integrally form a horn antenna having a slot portion and a cavity which communicates with the rear of the slot portion of the horn antenna;

a microwave circuit substrate;

a local oscillator mounted on the microwave circuit substrate and housed inside the cavity;

a horn antenna slot portion feeding point formed in the upper surface of the microwave circuit component; and a mixer diode positioned at the feeding point of the horn antenna and sandwiched between the microwave circuit component and the printed substrate, the mixer diode including a mixer diode substrate having a first protruding portion at a first end of the mixer diode substrate and a second protruding portion at a second end of the mixer diode substrate, separate anode and cathode electrode patterns formed on a surface of the substrate which includes the protruding portions, and a beam-lead-type or flip-chip-type diode which is mounted to a surface of the mixer diode substrate near the center thereof, the beam-lead-type or flip-chip-type diode having an anode and a cathode which are surface mounted to the anode and cathode electrode patterns to form electrically conducting pathways therewith, wherein the first and second protruding portions are directly or indirectly connected respectively to the microwave circuit component and the printed substrate.

9. The microwave detector of claim 8, further comprising an elastic body, wherein the elastic restoring force of the elastic body is used to bias the mixer diode substrate toward either the microwave circuit component or the printed substrate.

10. The microwave detector of claim 9, wherein the elastic body is made of an electrically conductive material so as to establish an electrically conducting pathway either between the mixer diode and the microwave circuit component or between the mixer diode and the printed substrate.

11. The microwave detector of claim 8, wherein the formation of at least one of the anode and cathode electrode patterns is extended over both side surfaces of the respective protruding portion of the mixer diode substrate.

12. The microwave detector of claim 8, wherein at least one of the anode and cathode electrode patterns is also formed on a rear surface of the mixer diode substrate, and at least one through hole is formed in the mixer diode substrate to connect the rear surface electrode pattern with the respective front surface electrode pattern.

13. The microwave detector of claim 8, further comprising a first connection hole formed in the microwave circuit component to connect the first protruding portion of the mixer diode to the microwave circuit component, and a second connection hole formed in the printed substrate to connect the second protruding portion of the mixer diode to the printed substrate, wherein the dimensions of the contacting surfaces inside at least one of the connection holes are formed to roughly match the dimensions of the respective protruding portion to enable the angular position of the mixer diode to be set at a desired angle with respect to the microwave circuit component by inserting the respective protruding portion into the connecting hole formed with matching dimensions.

14. The microwave detector of claim 8, wherein the mixer diode substrate is formed to have a length which is shorter than the distance between the microwave circuit component and the printed substrate, and further comprising a metallic connecting member which is mounted between the microwave circuit component and the printed substrate to form a series connection with the mixer diode substrate.

\* \* \* \* \*